United States Patent [19]

Gabrick

[11] 4,240,945
[45] Dec. 23, 1980

[54] SOLDER MASK COMPOSITION

[76] Inventor: Albert Gabrick, 2118 Tree Ridge Cir., Brea, Calif. 92621

[21] Appl. No.: 8,177

[22] Filed: Jan. 31, 1979

[51] Int. Cl.$^3$ .......................... C09D 3/52; C09D 3/66
[52] U.S. Cl. ................................ 260/21; 260/22 CQ; 427/154; 427/155; 427/156; 428/901
[58] Field of Search ............................. 260/21, 22 CQ

[56] References Cited

U.S. PATENT DOCUMENTS

| | | | |
|---|---|---|---|
| 3,365,321 | 1/1968 | Adler | 427/272 |
| 3,874,949 | 4/1975 | Kaneda et al. | 427/259 |
| 4,025,474 | 5/1977 | Porter et al. | 260/21 |
| 4,038,225 | 7/1977 | Takaya et al. | 260/21 |
| 4,064,287 | 12/1977 | Lipson et al. | 427/259 |
| 4,119,596 | 10/1978 | Okuda et al. | 260/21 |

*Primary Examiner*—Ronald W. Griffin
*Attorney, Agent, or Firm*—Robert E. Strauss

[57] ABSTRACT

There is disclosed a composition useful as a solder mask coating for use in the manufacture of printed circuit boards and the like which comprises a mixture of an alkyd resin and an alkylated amino resin, a minor quantity of a hydrocarbon resin, an inorganic filler derived from sedimentary shale of a particular origin, and sufficient organic solvent to provide a working viscosity suitable for silk-screening applications. The invention comprises also the use of a preferred and particular inorganic filler known as Panamint Earth.

19 Claims, No Drawings

SOLDER MASK COMPOSITION

BACKGROUND OF THE INVENTION

This invention relates to a solder mask composition and particularly to a one component, thermosetting system for use in producing screen relief images in the graphic arts and, in particular, for printed circuit boards, metal decorating and the like.

In the manufacture of printed circuit boards, the etched, printed circuit board, prior to soldering, receives a solder mask coating which is applied by a silkscreen process and cured into a protective film that encapsulates predetermined areas of the circuit boards so that only the circuit pads and selected areas of the board will accept molten solder in subsequent treatments.

Coatings which have been used for this purpose have been epoxy resins, urethane-alkyd and melamine-alkyd resin systems. The epoxy systems are objectionable because they require mixing of the hardener or catalyst with the resin shortly prior to use and have short shelf lives thereafter. Furthermore, lettering and number indexing inks adhere poorly to epoxy coatings, resulting in chipping and peeling of such inks from the printed circuit board.

The alkyd resin systems have a limited adhesiveness, particularly with high filler contents, a low resistance to scratching and to solder fluxes which impart blotchiness or a molted appearance to the product. The poor adhesiveness of these alkyd systems has, in the past, limited their use to copper relief images only and prevented their use on solder plated copper relief images.

Solder masking compositions, heretofore, have suffered from a number of disadvantages. The two component systems are objectionable because of their limited shelf life and the necessity to clean the silkscreen and other equipment immediately after use. The single component systems such as those of the alkyd resins, heretofore, have not accepted high loadings of inorganic fillers, as required to provide sufficient bodying characteristics to the coating composition. The alkyd resin systems have also not been suitable for use on solder plated copper image circuit boards and have had inadequate adhesion to withstand the hot oil washing required for removal of excess solder.

BRIEF STATEMENT OF THE INVENTION

We have now found that a single component, thermosetting solder mask composition, can be provided with a mixture of an alkyd resin and an alkylated amino resin by incorporating therein substantial quantities of an inorganic earth filler, particularly the filler known as Panamint, Earth and a minor amount of a hydrocarbon resin. The coating composition is mixed with sufficient quantities of a suitable solvent to impart the viscosity and working properties which permit application of the coating composition in a conventional silkscreening application. Since the solder mask coating composition is thermosetting, it has an infinite shelf life at ambient temperatures yet it can be quickly cured by heating of the coated circuit board to the necessary activation temperatures. The coating composition can be applied to copper and solder plated copper substrates and has a high resistance to peeling, lifting, wrinkling or chipping after immersion in molten solder, is not attacked by hot oil washing to remove excess solder from the board and it readily accepts lettering and indexing inks. The coating composition has excellent high temperature stability and has a very low moisture absorption with a high resistance to acids, alkalis and organic solvents.

DESCRIPTION OF PREFERRED EMBODIMENTS

The invention comprises a solder mask composition which is an organic coating mixture of an alkyd resin and an alkylated amino resin. The composition also contains a substantial quantity of an inorganic earth filler, particularly Panamint Earth, and a minor quantity of a hydrocarbon resin. It has been found that the combination of the aforedescribed components, within limited concentration ranges, imparts desirable operating characteristics to the coating composition making it ideally suited for use as a solder mask coating in the manufacture of printed circuit boards.

The composition of the invention has the proportions in weight percent (solvent-free) of the aforementioned ingredients which are set in the following table:

Table 1

| Component | Broad | Preferred |
| --- | --- | --- |
| Alkyd resin | 25–40 | 30–36 |
| Alkylated amino resin | 18–27 | 20–25 |
| Panamint Earth filler | 18–45 | 34–43 |
| Hydrocarbon resin | 2–5 | 2.8–3.5 |
| Pigment | 0–5 | 1–3 |

The aforementioned composition also contains a sufficient quantity of an organic solvent to reduce its viscosity to working values which permit the composition to be applied through silk screens. Generally, the viscosity of the composition should be reduced to a value of about 8,000 centipoises, measured on a Brookfield viscometer.

Alkyd resins are based on a prepolymer which is the condensation product of the reaction of a polyfunctional alcohol and a polyfunctional acid, typically a dibasic acid. The prepolymers are modified by reaction with fatty acids that function as extenders and impart coating properties such as flexibility and are classified according to the degree of their fatty acid modification. The short chain alkyd resins have from about 25 to about 45 weight percent fatty acid modification and are the reaction product of a dibasic unsaturated acid such as phthalic anhydride or isophthalic acid with a polyol or blend of polyols, an oil, and a fatty acid or a blend of synthetic acids. The medium chain oil alkyd resins have a similar composition with from 46 to 60 weight percent fatty acid modification and the long chain alkyd resins have 60 to 70 weight percent fatty acid modification. While all of these alkyd resins can be used in the invention, it is preferred to use the short and medium oil alkyd resins for most used. The long oil alkyd resins are useful and preferred for compositions that are applied to flexible printed circuit boards.

The fatty acids employed in the manufacture of the aforedescribed alkyd resin prepolymers include soya, soya and linseed mixtures, tofa, and coconut oil fatty acids. Various chain stopped alkyd resins can be used. The chain stopped resins are formed by reaction of monobasic acids such as benzoic with the resin and possess enhanced drying or curing and gloss retention. The chain stopped medium oil alkyd resins have been found to impart a high degree of water and solvent resistance to solder masks of the invention.

The alkylated amino resin which is used in combination with the aforedescribed alkyd resin in the film forming organic mixture is a methylol-melamine or methylol urea resin which is the condensation product of formaldehyde and the indicated polyamino compound. The condensation product is etherified by further reaction with an alkanol such as methyl, propyl, butyl, octyl alcohol, etc. to impart organic solvent solubility to the product. Of the aforementioned, the methylated and isobutylated methylol melamine condensation products are the preferred amino resins.

The inorganic earth filler which is used in the invention comprises a commercially available product known as Panamint Earth. This product is a sedimentary shale obtained from mines in Maricopa, Calif. The material is a complex mixture which exhibits a characteristic X-ray diffraction pattern. Quartz, feldspar and montmorillonite are identifiable minerals in this product. The product is commercially available in a finely subdivided state with a particle size range from 2 to 250 microns, average particle diameter. The particle size distribution of the typical commercial product is as follows:

Table 2

| Size | Weight Percent |
| --- | --- |
| +20 mesh | 7.70% |
| +30 mesh | 16.73% |
| +40 mesh | 13.09% |
| +50 mesh | 10.08% |
| +60 mesh | 4.81% |
| +100 mesh | 17.55% |
| +200 mesh | 8.07% |
| +325 mesh | 12.76% |
| −325 mesh | 9.22% |

The product consists chiefly of silicon and aluminum oxides with a small amount of calcareous substances. The quantitative analysis of the Panamint product is as follows:

Table 3

| Component | Weight Percent |
| --- | --- |
| Silicon | 21–35 |
| Aluminum | 15–28 |
| Calcium | 2–3 |
| Iron | 1–2 |
| Other Metals* | less than 2 |

*Magnesium, sodium, potassium, lithium, strontium, and copper.

The preferred filler has a density of 2.5 grams per cubic centimeter, a porosity of 45% and an organic absorption of 0.35 grams per gram.

The hydrocarbon polymers which are useful in the invention in minor quantities include the hydrocarbon polymers which are derived largely from mixed monomers of petroleum origin and characterized by high adhesive and cohesive properties, heat resistance and high peel strength. These hydrocarbon polymers can be polymers of $C_5$ to $C_{12}$ aliphatic hydrocarbons with average molecular weights of 2000 to 4000, as well as terpene based hydrocarbon resins. The terpene or beta-pinene materials can also be polymerized or copolymerized with phenol. Hydrocarbon resins have been used in the coating industry for many years, originally in the form of coumarone-indene resins derived from coal tar. Today, most hydrocarbon resins are produced from by-product petroleum fractions and streams, cross blending and control of these petroleum fractions and streams utilizing catalytic and pressure type processes permit the polymerization of these petroleum fractions into thermoplastic and thermoreactive hydrocarbon resins. The hydrocarbon resins are neutral, having an acid number of less than one (1), range in iodine number from 0 to 150 and exhibit melting points up to and including 150° C. These polymers are chemically inert, unaffected by acids, alkalis, and water, and are absorbed by Panamint earth-filler along with the melamine-alkyd resin system to synergistically impart the chemical, electrical, and humidity resistance, along with the physical and adhesion characteristics of the composition. An important effect of the hydrocarbon resin is to impart a plasticity to the coating and prevent it from becoming brittle when it is contacted with hot solder.

Various pigments can be used to impart the desired coloration to the coating. Examples of suitable materials include phthalocyanine pigments and inorganic pigments that are compatible with the resins. The inorganic pigments comprise oxides of metals such as chromium, antimony, nickel, titanium, zinc, iron, aluminum, cobalt, copper, etc., as well as phosphates of metals such as cobalt and the sulfides and selenides of metals such as cadnium.

The solvent can be any suitable organic solvent or mixture of solvents. The solvent should have a boiling point from about 300° to about 400° F. Good solvents for the composition are esters such as the ethylene glycol monoalkyl ($C_1$–$C_6$) ether acetates, e.g., ethylene glycol monoethyl ether acetate, ethylene glycol monobutyl ether acetate, etc. These are commercially available under a Cellosolve trade designation. Another related group of useful solvents are the mono and dialkyl diethylene glycol monomethyl ether, diethylene glycol diethyl ether, diethylene glycol monobutyl ether, etc., which are commercially available under a Carbitol trade designation. Of these, the higher boiling esters and ethers are preferred since they retard the drying of the solder mask coating composition after its application. Aromatic solvents are also good solvents, such as toluene, xylene and higher boiling fractions with distillation ranges from 325° to 408° F., such as Solvesso 150 and SC-150, are commercially available aromatic solvents. Aromatic solvents having boiling points from 325° to about 475° F., e.g., toluene, xylene, etc., can be used in combination with the aforementioned esters.

The choice of the solvent or blend of solvents is determined by the desired application. With automated processing which uses mechanized screening applications of the solder mask, fast setting of the coating is desired and the more volatile solvents are used. The higher boiling solvents are preferred for manual silk screen applications.

The compositions are prepared by mixing under high sheer stirring for a period of 30 to about 90 minutes, preferably for 45 to about 60 minutes. After mixing, the ingredients are then passed through a roller mill to complete the processing and then packaged for shipment to the consumer.

The following table sets forth suitable solder mask compositions in parts by weight in accordance with this invention:

Table 4

| Ingredient | 1 | 2 | 3 | 4 | 5 | 6 | 7 |
| --- | --- | --- | --- | --- | --- | --- | --- |
| Butyl Cellosolve Acetate | 6 | 6 | | | 6 | 6 | 6 |
| Methyl Collosolve Acetate | | | | | 6 | | |
| Butyl Carbitol Acetate | | | 6 | | | | |

Table 4-continued

| Ingredient | 1 | 2 | 3 | 4 | 5 | 6 | 7 |
|---|---|---|---|---|---|---|---|
| SC-150 | 4.3 | 4.3 | 4.3 | 4.3 |  | 4.3 | 4.3 |
| Xylol |  |  |  |  | 3.0 |  |  |
| Isobutanol |  |  |  |  | 1.3 |  |  |
| Panamint |  |  |  |  |  |  |  |
| 2-250 Microns | 15 | 15 | 15 | 15 |  |  |  |
| 100 Microns |  |  |  |  | 15 |  |  |
| 50 Microns |  |  |  |  |  | 15 |  |
| 2-100 Microns |  |  |  |  |  |  | 15 |
| Pigment[2] |  |  |  |  |  |  |  |
| Green | .8 |  | .8 |  | .8 |  | .8 |
| Blue |  | .8 |  | .8 |  | .8 |  |
| Alkyd Resin |  |  |  |  |  |  |  |
| Med-Soya | 12.8 |  |  |  |  |  |  |
| Tofa |  | 12.8 |  |  |  |  |  |
| Soya |  |  | 12.8 |  | 12.8 |  |  |
| Coconut |  |  |  | 12.8 |  |  |  |
| Tall/Castor |  |  |  |  |  | 12.8 |  |
| Med-Stopped |  |  |  |  |  |  | 12.8 |
| Methylol-Melamine Resin |  |  |  |  |  |  |  |
| Methylated | 8.5 |  |  |  |  |  |  |
| Isobutylated |  | 8.5 |  | 8.5 |  | 8.5 | 8.5 |
| Butylated |  |  | 8.5 |  | 8.5 |  |  |
| Hydrocarbon Polymer |  |  |  |  |  |  |  |
| MP 140°-150° C. MW 1500-2000 | 1.3 | 1.3 |  |  |  |  |  |
| Beta-pinene MW 1500-3000 |  |  | 1.2 | 1.3 | 0.8 |  |  |
| MP 150° C.[2] |  |  |  |  |  | 1.0 |  |
| MP 150° C.[3] |  |  |  |  |  |  | 1.0 |

[1] Phthalocyanine pigments
[2] Unsaturated, acid number less than 1
[3] Saturated, iodine number less than 50

EXAMPLE 1

A coating composition of the formulation set forth in Sample No. 1 of Table 4 was applied onto a copper plate, typical of that used for copper base circuit boards through a 110 mesh polyester screen having five strips of varied widths of ½, ¼, ⅛, ⅛, and ⅛ inch. The screen was 6 inches in length. The coating composition was applied through the silkscreen using a conventional squeegee application, the silkscreen was removed and the coated plate was placed in a forced air oven and heated to a temperature of about 275° F. for 45 minutes to cure the composition. Molten solder was flowed across the surface of the coated plate, the plate was cooled, washed with hot oil at 500° F. to remove any solder residue, and visually inspected for appearance and uniformity of the solder coating.

The plate had an excellent and uniform appearance, free of any reticulation and devoid of any blotches of discoloring and the solder adhered uniformly to the unmasked areas.

EXAMPLE 2

The preceding example was repeated with the substitution of 25 weight percent talc for the Panamint filler previously employed. The circuit board was inspected after washing of the excess solder and it was observed that the masked surface coated with the composition had a spotted appearance resulting from the attack of the acid fluxes in the solder composition and had an entirely reticulted pattern, resulting from inadequacies of the composition to uniformly coat the plate uniformly.

EXAMPLE 3

Example 1 was again repeated with the elimination of the hydrocarbon polymer from the composition and using 18 weight percent Panamint. The plate, after washing to remove excess solder, was inspected and it was observed that the masked areas experienced a considerable attack from the acid fluxes of the solder composition as evidenced by blotches on the coating.

EXAMPLE 4

Example 3 was repeated; however, the Panamint content in the composition was increased to 25 weight percent. No hydrocarbon polymer was employed in the composition. After the excess solder had been washed with hot oil, it was observed that the coating composition was unsatisfactory since the coated areas displayed a high degree of reticulation and spots, the latter resulting from the attack of the acids of the solder fluxes.

EXAMPLE 5

Example 2 was repeated with the 25 weight percent talc in the composition; however, the hydrocarbon polymer was deleted from the composition. The plate was inspected and it was observed that the solder had caused severe blotching of the coating composition.

EXAMPLE 6

The coating composition of Sample No. 1 set forth in Table 4 was employed in the experiment. The composition was applied over a solder-coated copper base. It was observed that the coating composition uniformly covered the solder-coated plate with a high degree of definition and without any observable reticulation. The solder was applied and it was observed that the coating composition was inert to the solder and the acid flux since, after the solder application, the coated areas remained free of any blotches or spots.

The invention has been described with reference to the illustrated and presently preferred embodiments. It is not intended that the invention be unduly limited by this disclosure of preferred embodiments. Instead, it is intended that the invention be defined by the ingredients, and their obvious equivalents, of the compositions set forth in the following claims.

What is claimed is:

1. A composition useful as a solder masking coating which consists essentially of:
   (a) a film former comprising:
      (1) from 25 to about 40 weight percent of an alkyd resin of a polyester prepolymer extended with from about 25 to about 70 weight percent fatty acid;
      (2) from 18 to about 27 weight percent of an alkylated amino resin selected from the class consisting of methylol-melamine and methylol-urea condensates etherified with alkanols of 1 to about 6 carbons;
      (3) from 30 to about 45 weight percent Panamint earth having a particle size passing a screen size from 20 to 325 mesh, and weight contents of from 21 to 35 percent silicon, 15 to 28 percent aluminum, 2 to 3 percent calcium, and 1 to 2 percent iron, and a porosity of 45 percent; and
      (4) from 2 to about 5 weight percent of a hydrocarbon polymer having a melting point no greater than about 150° C.; and (b) sufficient organic solvent to provide a viscosity no greater than about 9,000 centipoises.

2. The composition of claim 1 wherein said alkyd resin is present at a concentration from 30 to 36 weight percent.

3. The composition of claim 1 wherein said alkylated amino resin is present at a concentration from 20 to 25 weight percent.

4. The composition of claim 1 wherein said Panamint earth filler is present at a concentration of 34 to 43 weight percent.

5. The composition of claim 1 wherein said hydrocarbon polymer is present at a concentration from 2.8 to 3.5 weight percent.

6. The composition of claim 1 wherein said Panamint earth filler has a size range from 2 to 250 microns.

7. The composition of claim 1 wherein said alkyd resin is a short to medium chain alkyl containing up to about 60 percent fatty acid.

8. The composition of claim 1 wherein said alkyl resin is a long chain alkyl containing from 60 to about 70 weight percent fatty acid.

9. The composition of claim 1 wherein said alkylated amino resin is an alkylated methylol-melamine resin.

10. The composition of claim 9 wherein said amino resin is etherified with methanol.

11. The composition of claim 9 wherein said amino resin is etherified with isobutanol.

12. The composition of claim 9 wherein said amino resin is etherified with butanol.

13. The composition of claim 1 wherein said hydrocarbon polymer has a molecular weight of 1500 to 2000.

14. The composition of claim 1 wherein said hydrocarbon polymer has a molecular weight of 1500 to 3000.

15. The composition of claim 1 wherein said hydrocarbon polymer is a beta-pinene resin.

16. The composition of claim 1 wherein said hydrocarbon polymer has a melting point between 140° and 150° F.

17. The composition of claim 1 wherein said solvent comprises an ethylene glycol ether.

18. The composition of claim 16 wherein said solvent is an ethylene glycol mono ($C_1$–$C_6$) alkyl ether acetate.

19. The composition of claim 18 wherein said solvent includes an aromatic boiling between 300° and 425° F.

* * * * *